United States Patent
Chan et al.

(10) Patent No.: US 9,023,733 B2
(45) Date of Patent: May 5, 2015

(54) METHOD FOR BLOCK-COPOLYMER LITHOGRAPHY

(71) Applicants: IMEC, Leuven (BE); Tokyo Electron Limited, Tokyo (JP)

(72) Inventors: Boon Teik Chan, Leuven (BE); Shigeru Tahara, Yamanashi (JP)

(73) Assignees: IMEC, Leuven (BE); Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/038,565

(22) Filed: Sep. 26, 2013

(65) Prior Publication Data

US 2014/0091435 A1  Apr. 3, 2014

(30) Foreign Application Priority Data

Oct. 2, 2012 (EP) .................................... 12187058

(51) Int. Cl.
| | |
|---|---|
| *H01L 21/302* | (2006.01) |
| *H01L 21/461* | (2006.01) |
| *H01L 21/4763* | (2006.01) |
| *H01L 21/20* | (2006.01) |
| *H01L 21/36* | (2006.01) |
| *H01L 21/027* | (2006.01) |
| *B81C 1/00* | (2006.01) |
| *H01L 21/033* | (2006.01) |
| *H01L 21/311* | (2006.01) |

(52) U.S. Cl.
CPC ........ *H01L 21/0271* (2013.01); *B81C 1/00031* (2013.01); *H01L 21/0337* (2013.01); *H01L 21/31138* (2013.01)

(58) Field of Classification Search
USPC ......... 438/706, 710, 714, 712, 622, 623, 624, 438/494, 709, 735, 738, 498; 257/618
See application file for complete search history.

(56) References Cited

U.S. PATENT DOCUMENTS 7,449,414 B2 * 11/2008 Ventzek et al. ............... 438/706
8,382,997 B2 * 2/2013 Metz .............................. 216/49
(Continued)

FOREIGN PATENT DOCUMENTS

WO  WO2010/096363 A2  8/2010
WO  WO2012/031818 A2  3/2012

OTHER PUBLICATIONS

European Search Report, European Patent Application No. 12187058.8, dated Mar. 19, 2013.
(Continued)

*Primary Examiner* — A. Sefer
*Assistant Examiner* — Dilinh Nguyen
(74) *Attorney, Agent, or Firm* — McDonnell Boehnen Hulbert & Berghoff LLP

(57) ABSTRACT

The present disclosure relates to a method (10) for block-copolymer lithography. This method comprises the step of obtaining (12) a self-organizing block-copolymer layer comprising at least two polymer components having mutually different etching resistances, and the steps of applying at least once each of first plasma etching (14) of said self-organizing block-copolymer layer using a plasma formed from a substantially ashing gas, and second plasma etching (16) of said self-organizing block-copolymer layer using plasma formed from a pure inert gas or mixture of inert gases in order to selectively remove a first polymer phase. A corresponding intermediate product also is described.

20 Claims, 4 Drawing Sheets

(56) References Cited

U.S. PATENT DOCUMENTS 8,551,877 B2 * 10/2013 Ranjan et al. ............... 438/622
2011/0300699 A1 12/2011 Molas et al.

OTHER PUBLICATIONS

Jung, Yeon Sik et al., "Nanofabricated Concentric Ring Structures by Templated Self-Assembly of a Diblock Copolymer", NANO Letters, vol. 8, No. 9, 2008, pp. 2975-2981.

Liu, Chi-Chun et al., "Pattern Transfer Using Poly (Styrene-Block-Methyl Methacrylate) Copolymer Films and Reactive Ion Etching", Journal of Vacuum Science and Technology, Part B, vol. 25, No. 6, Dec. 6, 2007, pp. 1963-1968.

Zhang, Congchun et al., "Deep Reactive Ion Etching of Commercial PMMA in O2/CHF3, and O2/Ar-Based Discharges", Journal of Micromechanics and Microengineering, vol. 14, 2004, pp. 663-666.

Somervell, Mark et al., "Comparison of Directed Self-Assembly Integrations", SPIE Advanced Lithography, Feb. 2012, 14 pages.

* cited by examiner

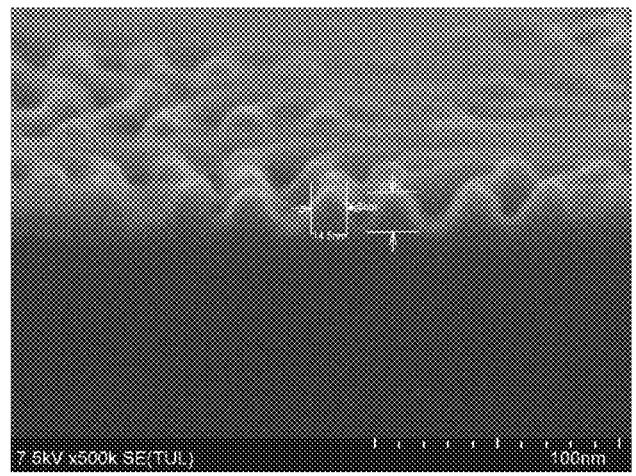
FIG. 6 – PRIOR ART
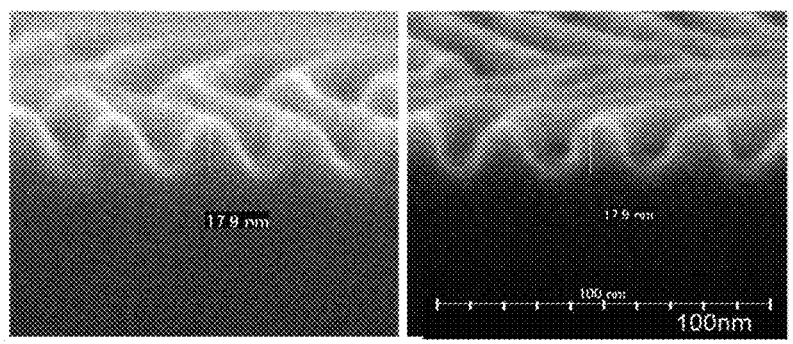
FIG. 7 – PRIOR ART    FIG. 8
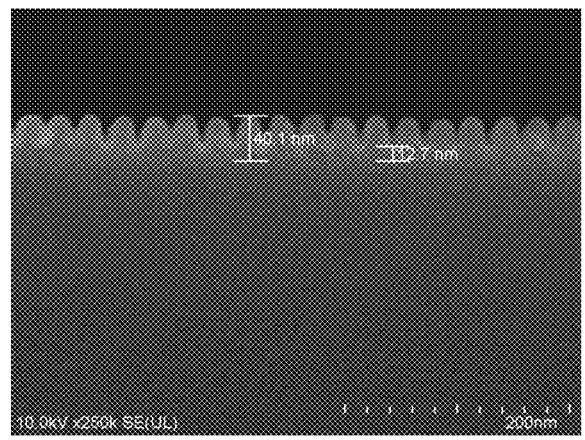
FIG. 9

METHOD FOR BLOCK-COPOLYMER LITHOGRAPHY

CROSS-REFERENCE TO RELATED APPLICATIONS

This application claims the benefit of priority of European Patent Application no. 12187058.8 filed Oct. 2, 2012, which is hereby incorporated herein by reference in its entirety.

FIELD OF THE DISCLOSURE

The disclosure relates to the field of nanolithography, e.g. nanolithography for the production of semiconductor integrated circuits or nanoelectromechanical systems. More specifically it relates to a method for etching self-assembled block-copolymer materials.

BACKGROUND OF THE DISCLOSURE

In semiconductor manufacture, a need exists to achieve higher component densities and smaller, e.g. nanoscale, structures in integrated circuits and nanoelectromechanical systems. The lithography techniques to produce semiconductor devices typically involve applying patterns of the device structure onto a resist layer, and selectively etching away the substrate exposed by the pattern in the resist layer. In further processing steps, other materials may be deposited in the etched areas to form, for example, an integrated circuit.

In conventional photolithography a pattern mask is projected by light onto a photo-sensitive polymer resist. However, the resolution of this approach is inherently limited by diffraction. Alternatively, a pattern may also be transferred to a suitable resist layer by energy waves of a different radiative quality, such as in electron beam lithography, ion beam lithography or x-ray lithography. However, with such lithography methods, producing nano-scale structures at an acceptable cost and industrially acceptable throughput remains difficult.

Directed self-assembly (DSA) of block-copolymers is an emergent alternative approach to nanolithography. Block-copolymers consist of chemically different polymer blocks interconnected by covalent bonds. The chemically different polymer blocks undergo a microphase separation, which is driven by repulsion between the dissimilar polymer chains, such that homogenous domains in a periodic nanostructure are formed after annealing. For example, such periodic structures may comprise hexagonally packed cylinders, spheres, gyroid structures or lammelae. The type of structure which is formed is furthermore controllable by tuning the ratios of the different polymer block lengths. However, the block-copolymer material may feature random orientation and a poor long-range order when not constrained by orientation control techniques. Such techniques, for example graphoepitaxy or chemical epitaxy, selectively direct the formation of domains in the block-copolymer material. Through subsequent selective removal of one polymer type, a patterned structure of gaps is formed which can be used as a resist layer on the underlying substrate, thus enabling feature patterning on scales in the range of 5 nm to 50 nm.

In DSA, a pre-pattern may be applied on the substrate to direct the orientation of the block-copolymer material when applied thereon. This pre-pattern may be used to achieve frequency multiplication, e.g. generating cross-bar structures or line patterns of higher spatial frequency than the pre-pattern, thus increasing the pitch of the final printed structure. Therefore, advanced scale-down patterning may be achieved by DSA with pattern features smaller than 14 nm. Moreover, DSA can be used to repair defects and improve uniformity in the original print, e.g. by shrinking and rectifying the pre-pattern. For example, in combination with EUV lithography, limitations imposed by local variations in the critical dimension (CD) may be overcome, which may be, for example, advantageous for manufacturing small contact features.

For selectively removing one polymer type in DSA by etching, an argon-oxygen ($Ar/O_2$) plasma may be used according to DSA BCP etching methods known in the art. In order to achieve higher selectivity between the polymer components, e.g. to efficiently remove polymethylmethacrylate (PMMA) while leaving polystyrene structures substantially unaffected in a polystyrene-block-polymethylmethacrylate (PS-b-PMMA) block-copolymer it may be known to reduce the $O_2$ concentration in $Ar/O_2$ gas mixture. For example, For a substantially pure Ar plasma with no bias, a PS/PMMA selectivity up to 8 may be achieved. By introducing 10% $O_2$ in the $Ar/O_2$ plasma, the selectivity may reduce, for example, to 2. Unfortunately, it is also known that an argon plasma without added oxygen may not yield acceptable PMMA etching, for example as indicated in FIG. 4, which shows a photographic reproduction of a PS-b-PMMA BCP layer after argon etching.

It is known in the art to provide a protective covering layer, for example using $CH_3F$ or $SiCl_4$, on top of the polystyrene to improve etching specificity. For example, in the International Patent Application No. WO 2012/031818, a first selective etching is used to reduce the thickness of one of the polymer domains, a planarization layer is deposited over the block-copolymer material, which is subsequently etched away such that caps remain over the polymer domain with reduced thickness. These caps protect the underlying material during a final etching phase.

SUMMARY OF THE DISCLOSURE

In certain aspects, embodiments of the present disclosure provide good dry etching of self-assembled block-copolymer material.

It is an advantage of certain embodiments of the present disclosure that high etching specificity is achieved, e.g. at least a ratio between a first polymer and a second polymer of 1 to 3. It is a further advantage of certain embodiments of the present disclosure that the height of one of the polymers is substantially less reduced or even remain substantially unreduced when etching away the other polymer. For example, for a polystyrene/pmma block-copolymer material, it is an advantage of certain embodiments of the present disclosure that polystyrene patterns in a PS-b-PMMA layer are substantially less reduced or even remain substantially unreduced when etching away the PMMA polymer blocks.

It is an advantage of certain embodiments of the present disclosure that assembled patterns in block-copolymer layers maintain a straighter profile when etched, compared to conventional $Ar/O_2$ etching. It is a further advantage of certain embodiments of the present disclosure that polystyrene polymer block patterns in a PS-b-PMMA layer maintain a straighter profile compared to conventional $Ar/O_2$ etching when etching away the PMMA polymer blocks. It is an advantage of certain embodiments according to the present disclosure that the amount of etch faceting can be low, e.g. reduced compared to conventional $Ar/O_2$ etching.

It is an advantage of certain embodiments of the present disclosure that PMMA material is removed efficiently from a PS-b-PMMA block-copolymer while leaving the polystyrene material substantially less affected or even unaffected. It thus is an advantage of certain embodiments of the present disclosure that the polystyrene structure height is maintained as much as possible for the remaining pattern transfer.

In certain aspects, the present disclosure relates to a method for block-copolymer lithography, the method comprising:

obtaining a self-organizing block-copolymer layer on a substrate, said self-organizing block-copolymer layer comprising at least two polymer components having mutually different etching resistances, said self-organizing block-copolymer layer furthermore comprising a copolymer pattern structure formed by micro-phase separation of said at least two polymer components, applying at least once each of first plasma etching of said self-organizing block-copolymer layer using plasma formed from a gas comprising an ashing gas, second plasma etching of said self-organizing block-copolymer layer using a plasma formed from a substantially pure inert gas or mixture of inert gases in order to selectively remove a first polymer phase.

Said applying second plasma etching may be performed, for example, at a plasma etch sputtering power lower or equal to the plasma etch sputtering power of the first plasma etching and/or wherein said applying second plasma etching is performed at a plasma etch gas pressure lower or equal to the plasma etch gas pressure of the first plasma etching.

The ashing gas may be, for example, oxygen.

The first plasma etching step may be, for example, applied at least once before application of the second plasma etching step.

The second plasma etching step may be, for example, applied at least once before application of the first plasma etching step.

Performing said first plasma etching and said second plasma etching may comprise, for example, repeating said first plasma etching and said second plasma etching at least once alternatingly.

Said substantially pure inert gas may, for example, be argon.

Said performing a first plasma etching of said layer may comprise, for example, using a plasma formed from an argon-oxygen gas mixture.

In certain embodiments, the method may furthermore comprise providing a pre-mask pattern on said substrate, said pre-mask pattern comprising a plurality of guides for aligning said copolymer pattern structure.

Said copolymer pattern structure may be formed, for example, by annealing the block copolymer layer.

Said block-copolymer may comprise, for example, a di-block copolymer comprising two types of polymer chains covalently bonded to each other.

Said di-block copolymer may comprise, for example, polystyrene-polyisobutene, polystyrene-isoprene, polydimethylsiloxane-polyisobutene, polystyrene-polyethylene oxide, polystyrene-polypropylene oxide, polyethyleneoxide-poly(cyanobiphenyloxy)hexyl methacrylate, polystyrene-polymethyl methacrylate, polystyrene-polymethacrylic acid, polyethylene oxide-polyvinylpyridine, polystyrene-polyvinylpyridine, or polyisoprene-polyhydroxystyrene.

Said block copolymer may comprise, for example, a tri-block copolymer in which two types of polymer chains A, B are bonded in an A-B-A form or in which three types of polymer chains A, B, C are bonded in an A-B-C form.

In certain embodiments, the method may furthermore comprise the step of etching the substrate using the remaining polymer component or components after etching away said first polymer component from the block copolymer layer as a resist mask.

In certain aspects, the present disclosure also relates to a partially fabricated integrated circuit, comprising a polymer pattern structure provided on a substrate, said polymer pattern structure being a block-copolymer layer wherein at least one polymer component has been etched away, said polymer pattern having a half pitch of less than 50 nm, advantageously less than 20 nm, more advantageously less than 16 nm.

Particular and preferred aspects of the disclosure are set out in the accompanying independent and dependent claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described hereinafter.

BRIEF DESCRIPTION OF THE DRAWINGS

FIG. 6 shows a photograph of a PS-b-PMMA layer obtained by a prior-art single-step $Ar/O_2$ mixture plasma etching method.

FIG. 7 shows a PS-b-PMMA layer etched using a prior-art single-step $Ar/O_2$ mixture plasma etching method.

FIG. 8 shows a PS-b-PMMA layer etched by a method according to embodiments of the present disclosure.

FIG. 9 shows a further example of a PS-b-PMMA layer etched using a method according to embodiments of the present disclosure.

Figure 1:
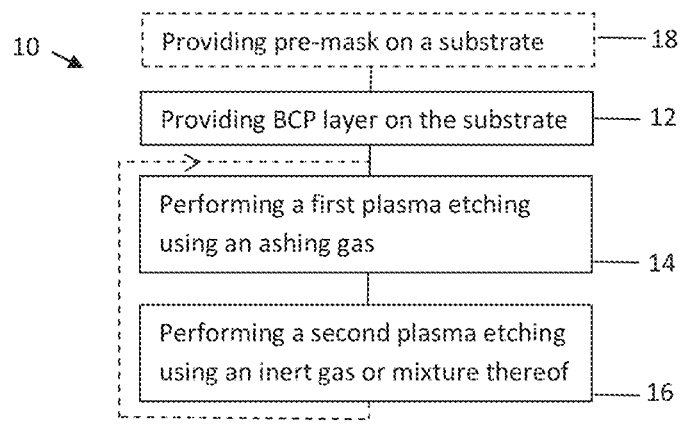
FIG. 1 shows an exemplary method according to embodiments of the present disclosure.

The drawings are only schematic and are non-limiting. In the drawings, the size of some of the elements may be exaggerated and not drawn on scale for illustrative purposes.

In the different drawings, the same reference signs refer to the same or analogous elements.

DETAILED DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the elements or steps listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Where in embodiments of the present disclosure reference is made to a "block-copolymer", reference is made to a polymer having two or more chemically different polymer blocks, for example a di-block, tri-block, star, comb or other polymer with controlled structure. The blocks may typically have different chemical properties, such as the degree of hydrophilicity or hydrophobicity. The blocks may typically be mutually immiscible, or only partially miscible, over a range of temperatures, e.g. to allow formation of separate micro-phase domains, thus enabling self-assembly. Self-assembly may be based on chemical differences between the different polymer blocks, e.g. a hydrophilicity/hydrophobicity imbalance. Such block-copolymers may be obtained by methods known in the art, for example by atom transfer radical polymerization, reversible addition fragmentation chain transfer polymerization, nitroxide-mediated polymerization, boron-mediated polymerization or catalytic chain transfer polymerization.

Where in embodiments of the present disclosure reference is made to "annealing", reference is made to a process that allows self-assembly of structures by micro-phase separation in a block-copolymer material.

Where in embodiments of the present disclosure reference is made to an ashing gas, reference is made to any gas known to remove photoresist, such as for example but not limited to $O_2$, $CO_2$, $SO_2$, $NO_2$, $N_2O$, $N_2/O_2$ or $H_2/N_2$ gas mixture. Such an ashing gas can be admixed with an inert (e.g. Ar) carrier gas/diluents.

In a first aspect, the present disclosure relates to a method for block copolymer lithography. This method comprises the step of obtaining a substrate with a self-organizing block-copolymer layer. This self-organizing block-copolymer layer comprises at least two polymer components having mutually different etching resistances. The self-organizing block-copolymer layer furthermore comprises a copolymer pattern structure formed by micro-phase separation of the at least two polymer components. The method further comprises applying at least once each of a first plasma etching 14 of said self-organizing block-copolymer layer using a plasma formed from a gas comprising at least an ashing gas, and a second plasma etching 16 of said self-organizing block-copolymer layer using plasma formed from a substantially pure inert gas or mixture of inert gases in order to selectively remove a first polymer phase. The second plasma etching is also referred herein as a soft sputter step. During the second plasma etching no reactive gases are used. Therefore the second plasma etching in the presence of a substantially pure inert gas or mixture of inert gases is a sputtering process. Whereas the order in which the plasma etching steps is performed can be either initially the first plasma etching followed by the second plasma etching or initially the second plasma etching followed by the first plasma etching, it has been found that initiating the etching process with the plasma etching step using plasma formed from a gas comprising at least an ashing gas is advantageous. The order of the etching steps thus may be advantageously as indicated in FIG. 1, but in some embodiments also may be inverted, i.e. second etching step 16 advantageously is performed initially, before first etching step 14. The first plasma etching thereby is performed in such a way that a plasma etch sputtering power of the second plasma etching is lower or equal to the plasma etch sputtering power of the first plasma etching and/or a plasma etch gas pressure of the second plasma etching is lower or equal to the plasma etch gas pressure of the first plasma etching.

It is to be noticed that in none of the etching steps a deposition gas (such as a C-comprising gas) is used.

By way of illustration, embodiments of the present disclosure not being limited thereto, the method will now be further described with reference to FIG. 1, illustrating standard and optional steps for the etching method.

Referring to FIG. 1, an exemplary method 10 for block-copolymer lithography, e.g. for etching a substrate having a block-copolymer layer provided thereon, according to embodiments of the present disclosure is shown. Such method may be useful in the field of integrated circuits, for example as a means to reduce transistor size and spacing and/or to correct defects in small-size features. Thus, features smaller than 100 nm, e.g. features smaller than 50 nm, for example features of smaller than 20 nm, e.g. features smaller than 16 nm, or features of 14 nm, or smaller than 10 nm, for example 5 nm, may be achieved in integrated circuits by application of a method according to embodiments of the present disclosure.

This method 10 comprises the step of obtaining 12 a self-organizing block-copolymer layer on a substrate, for example, on a semiconductor substrate, such as a silicon substrate, or on a silicium dioxide substrate. This substrate may also be a layered structure, e.g. a silicon-insulator-silicon structure, and/or may have structures provided therein by previous processing steps. The self-organizing block-copolymer layer comprises at least two polymer components having mutually different etching resistances. For example, a polymeric composition consisting of two or more chemically different homopolymer blocks connected by covalent bonds at their chain ends may be coated onto the substrate, e.g. by brushing, rolling, spraying, inkjet application or spin-coating. The polymeric composition may furthermore comprise additives, e.g. adhesives, adhesion promoters and/or solvents. For example, the self-organizing block-copolymer layer may be formed from a di-block copolymer composition comprising two types of polymer chains covalently bonded to each other. For example, such di-block copolymer may comprise polystyrene-polyisobutene, polystyrene-isoprene, polydimethylsiloxane-polyisobutene, polystyrene-polyethylene oxide, polystyrene-polypropylene oxide, polyethyleneoxide-poly(cyanobiphenyloxy)hexyl methacrylate, polystyrene-polymethacrylic acid, polyethylene oxide-polyvinylpyridine, polystyrene-polyvinylpyridine, or polyisoprene-polyhydroxystyrene. Preferably, such di-block copolymer may comprise polystyrene (PS) chains covalently bonded to polymethyl methacrylate (PMMA) chains, in which the polystyrene and PMMA have an advantageous etch resistance ratio for dry etching with argon plasma. Alternatively, the self-organizing block-copolymer layer may be formed from a tri-block copolymer composition, for example in which two types of polymer chains A, B are bonded in an A-B-A form or in which three types of polymer chains A, B, C are bonded in an A-B-C form.

The self-organizing block-copolymer layer furthermore has a copolymer pattern structure formed by micro-phase separation of the at least two polymer components. For example, the polymeric composition coated onto the substrate may be annealed, e.g. at a temperature higher than the glass-transition or melting temperature, during which the components of the polymeric composition may self-assemble into structured domains, thus forming the copolymer pattern structure. For example, thermal annealing may be used at a temperature above the lowest value of the glass transition or melting temperature of at least one polymeric component of the composition. Annealing time may be selected to allow self-assembly, and may be in the range of 0.01 hours to 300 hours, preferably between 0.1 hours and 24 hours.

By selecting an appropriate total chain length and molecular weight of each block in the block-copolymer, e.g. selecting an appropriate Flory Huggins parameter, as known in the art, the morphology of this copolymer pattern structure may be tuned, e.g. in order to create lamellae, cylinders or spheres in the block-copolymer layer. The molecular weight of the block-copolymer may be, for example, selected such that the end-to-end distance of the blocks is commensurate with the smallest feature of the intended pattern. Preferred molecular weights may range, for example, from 200 to 1000000 g/mol, e.g. from 2000 to 100000 g/mol.

Figure 2:
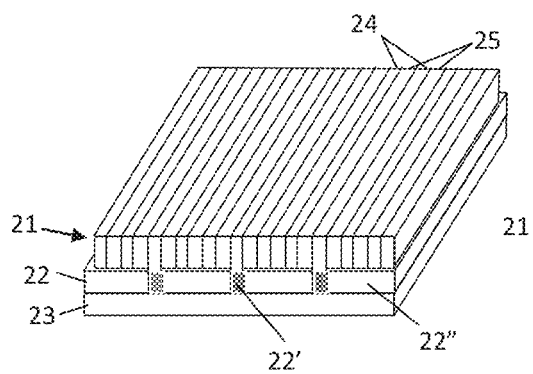
FIG. 2 shows a self-assembled di-block copolymer layer for use in a method according to embodiments of the present disclosure.
Figure 3:
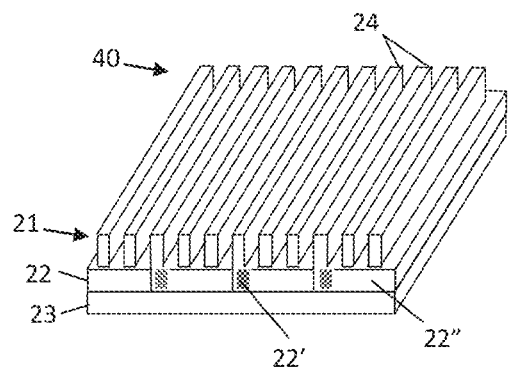
FIG. 3 shows the self-assembled di-block copolymer layer after etching away one polymer component using a method according to embodiments of the present disclosure.

In embodiments according to the present disclosure, the method 10 may comprise providing 18 a pre-mask pattern on the substrate. Such pre-mask pattern may comprise a plurality of guides for aligning the copolymer pattern structure. This plurality of guides may be formed by local differences in a physical or chemical property, e.g. local differences in hydrophilicity. The pre-mask may be created by methods as known in the art. For example, graphoepitaxy methods may be used to inscribe a relief structure on the substrate, such that the low spatial frequency pattern thus formed may be used to constrain and align the high spatial frequency block copolymer pattern. Similarly, chemo-epitaxy methods may be used to provide a pattern on the substrate in which local differences of chemical properties, e.g. hydrophilicity, induce a preferential alignment of a polymer component in the BCP along these patterns. Thus, the alignment of the copolymer pattern structure may be based on preferential attraction of one phase component to the pre-mask pattern, e.g. based on different chemical properties of the phase components, such as a difference in hydrophilicity/hydrophobicity. Thus, a replication of the pre-mask pattern may be obtained in the copolymer pattern structure, e.g. a spatial frequency multiplication of the pre-mask pattern in the vicinity of the substrate. Optionally, the top part of the block-copolymer layer, e.g. starting from the side removed from the substrate, may be removed, for example by a uniform, e.g. a selective, etching, cutting or grinding step, in order to remove the region in which this pattern replication may deviate from the pre-mask. For example, FIG. 2 illustrates a block-polymer layer 21 after annealing, with a laminar copolymer pattern structure registered to layer 22 provided on a substrate, e.g. the silicon substrate 23. Layer 22 may comprise a premask pattern. In addition, layer 22 may comprise a neutral layer (NUL), which may for example be a mixture of about 50% polystyrene and about 50% PMMA. Methods for creating the premask 22' are known from by the person skilled in the art and may for example be created as described in "Comparison of Directed Self-Assembly Integrations" by Somervell et al. published at SPIE Advanced Lithography, February 2012. By way of illustration, premask pattern 22' and neutral layer 22" are shown in FIG. 2 and FIG. 3. For example, the block-polymer layer 21 may comprise alternating block domains of a first polymer component, e.g. polystyrene 24 and a second polymer component, e.g. PMMA 25. FIG. 3 illustrates the block polymer layer 21 after etching away the second polymer component, e.g. PMMA 25.

The method 10 further comprises performing each of a first plasma etching 14 and a second plasma etching 16 at least once. It is to be noticed that either the first plasma etching or the second plasma etching may be performed as initial etching step, whereby the other plasma etching step is than subsequently applied. The first plasma etching 14 thereby is plasma etching of the self-organizing block-copolymer layer using a plasma formed from an ashing gas. Such an ashing gas may be any suitable ashing gas. One example of an ashing gas that can be used is oxygen. In some embodiments, in order to prevent ashing to occur too fast, the ashing gas may be present in a concentration less than 50%, advantageously less than 20%, still more advantageously less than 10%. This first plasma may in one example be formed from a mixture of an inert gas and oxygen, for example a mixture of the same inert gas as used for the second plasma etching 16 and oxygen. For example, this first plasma may be formed from 95% argon and 5% oxygen. Obviously, such mixture may contain traces of other elements or molecules in small amounts which are known not to influence the etching in a significant manner. The first plasma etching 14 may comprise a reactive ion etching step.

The second plasma etching 16 thereby is plasma etching of the self-organizing block-copolymer layer using a plasma formed from a substantially pure inert gas in order to selectively remove a first polymer phase. Substantially pure refers to a gas mixture comprising only negligible amounts of impurities, and should be interpreted as preferentially pure, although such mixture may contain traces of other elements or molecules in such small amounts as are known not to influence plasma etching in a significant manner. Inert gas refers to a gas which does not, or does only in negligible degree, undergo chemical reactions with the block-copolymer material and its constituents. For example, noble gases and nitrogen may not react or only react weakly with organic compounds. This second plasma etching 16 may comprise a sputtering step. For example, an argon (Ar) plasma may be used to selectively remove material corresponding to one polymer component, e.g. PMMA, while leaving the copolymer pattern structure formed in the other polymer component, e.g. polystyrene, in place. If the copolymer comprises more than two components, the etch resistance to etching with this inert gas may differ for these components such that three-dimensional structures may be formed by etching, e.g. substantially etching away a first component, etching away a second component to a lesser degree, and leaving a third component even less affected.

For example, for a polystyrene-block-poly(methylmethacrylate) layer (PS-b-PMMA), the argon plasma may remove the PMMA without destroying the polystyrene pattern structure. For example, a dry etching step with argon plasma, without bias, may achieve a PMMA versus PS selectivity of, for example, 8.

Figure 4:
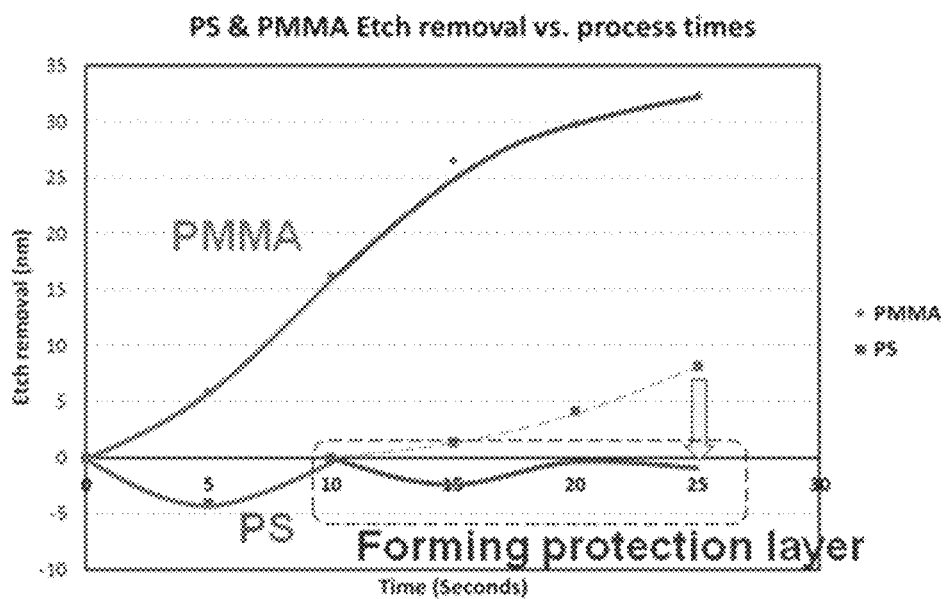
FIG. 4 shows the formation of the protection layer during an Ar sputtering step of an exemplary method according to an embodiment of the present disclosure.

As indicated above, the initial etching step may be either the first plasma etching step or the second plasma etching step and these steps may be performed repeatedly and alternatingly. The steps of performing a first plasma etching 14 and performing a second plasma etching 16 may be repeated at least once, e.g. repeated until substantially all material corresponding to a polymer phase is removed. For example, the switching between an Ar plasma and an Ar/O2 plasma may require a few cycles, e.g. 2 cycles or less than 10 cycles, until substantially all PMMA material is removed, while maintaining the polystyrene structure with a straight profile. While a single application of the etchings 14 and 16 may suffice, it may be advantageous to alternate between these steps in multiple cycles. The latter is especially advantageous when thicker layers of PMMA are used. By way of illustration, the formation of the protection layer on top of the polystyrene during the Ar sputtering step as described in the present example, is illustrated in FIG. 4.

Figure 5:
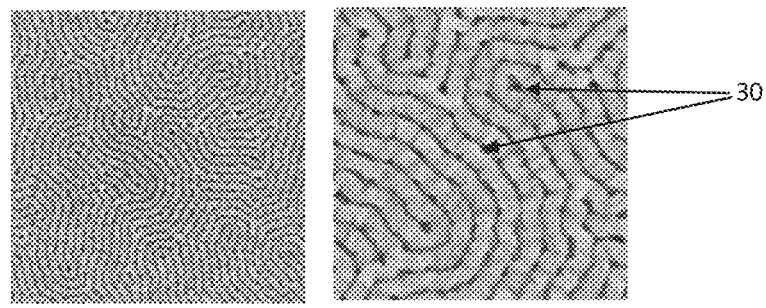
FIG. 5 shows a photographic reproduction of a block-copolymer layer after etching with a pure argon plasma.

It is an advantage of at least some embodiments of the present disclosure that this first plasma etching 14 may remove etch residue from the second etching step 16, e.g. in a PS-b-PMMA layer, non-volatile PMMA etch residue which was sputtered or re-deposited on the polystyrene may be converted by the oxygen etching step 14 into volatile material and subsequently efficiently removed. It is furthermore an advantage of such two-step etching 14,16 or 16,14 according to embodiments of the present disclosure, when compared to single-step etching with, for example, an Ar/O$_2$ mixture plasma, that a specific etching is reduced, e.g. the polymer pattern formed by the remaining polymer component, e.g. polystyrene, after etching is better preserved. For example, referring to FIG. 5, a photograph of a PS-b-PMMA layer is shown after a second plasma etching step 16 obtained with pure Argon gas, showing the etch residue 30 accumulated on the polystyrene. Although a high selectivity may be obtained by Argon etching alone, these residues are undesirable, since sharp definition of edges and corners may be considered advantageous in, for example, high-resolution semiconductor manufacture.

Further considering the example of PS-b-PMMA etching for simplicity, the sputtered and re-deposited PMMA on the polystyrene, generated in the second plasma etching step 16, may have a self-masking effect, thus serving as an etch reduction layer for the polystyrene. This etch reduction layer is subsequently removed during the first plasma etching step 14 in the sequence 16, 14. Therefore, a steeper pattern slope profile and better preservation of fine scale structures may be achieved by a method 10 according to embodiments of the present disclosure. As an example, FIG. 6 shows a photograph of PS-b-PMMA layer obtained by a prior-art etching method using a single-step Ar/O2 etching step. As can be seen, the polystyrene has been reduced and the slope profile of the pattern has degraded.

Figure 10:
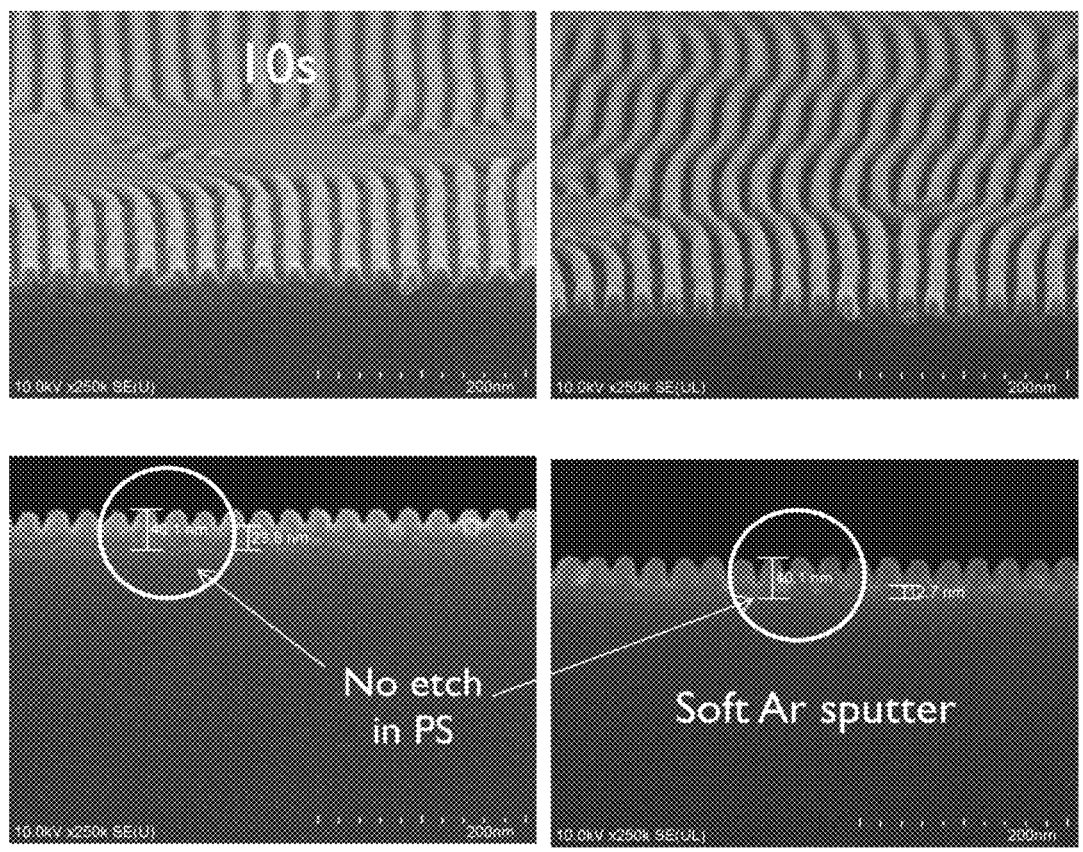
FIG. 10 illustrates an example of an advantageous method applying $Ar/O_2$ etching followed by soft Ar sputtering, compared to a conventional ($Ar/O_2$) etching process, illustrating features of an advantageous embodiment according to the present disclosure.

For comparison, FIG. 7 shows a PS-b-PMMA layer etched using a prior-art method, by 21 s exposure to Ar/O2 plasma, while FIG. 8 shows a similar layer etched by a method according to the present disclosure, by consecutively 14-16-14 process steps: 10 s Ar/O2, 10 s Ar and 10 s Ar/O2 plasma exposure. As can be seen, the layer in FIG. 8 shows a better definition of steep edges and sharp features for the same profile height, whereby there is no etch in the polystyrene (as also visible in FIG. 10, which will be discussed later).

Furthermore, in embodiments according to the present disclosure, the method 10 may comprise the step of etching the substrate using the remaining polymer component or components, e.g. the pattern formed in polystyrene, after etching away said first polymer component, e.g. the PMMA material, from the block copolymer layer as a lithographic resist mask.

In a second aspect, the present disclosure relates to an at least partially fabricated integrated circuit 40, e.g. as shown in FIG. 3, which comprises a polymer pattern structure 24 provided on a substrate 23. This polymer pattern structure is obtained by etching away at least one polymer component 25 of a block-copolymer layer 21 by a method according to the first aspect of the present disclosure. Such a structure typically comprises a block-copolymer layer wherein at least one polymer component (25) has been etched away, said polymer pattern having a half pitch of less than 50 nm, advantageously less than 20 nm, more advantageously less than 16 nm.

By way of illustration, embodiments of the present disclosure not being limited thereto, a discussion of results obtained using a combination of a soft Argon sputtering and Argon/oxygen sputtering for etching pmma according to an embodiment of the present disclosure is given below.

The directed self-assembly samples used for the present example wherein the PMMA & neutral layer etch are optimised, were prepared using chemo-epitaxy flow. A 30 nm thick block-copolymer (PS-b-PMMA) film was coated and annealed on top of the neutral layer. The neutral layer (8 nm)

was a mixture of the polystyrene and PMMA. The block-copolymers were self-aligned with the guiding stripes of cross-linked polystyrene (PS) on opt of a silicon nitride substrate. After annealing, the block-copolymer formed 14 nm half-pitch lamellar PMMA/PS line/space structures.

In different examples, a combination was made of both an etching step using a mixture of argon and oxygen, whereafter a soft Ar sputter step is applied. The etching step in Ar/O2 plasma (14) was performed with 850 sccm Ar/60 sccm $O_2$, a plasma etch gas pressure of 75 mT to 150 mT and a plasma etch sputtering power of 70 W to 300 W. The second etching step (16) also referred to as the soft Ar sputter step was performed with an Ar flow of about 850 sccm at a plasma etch gas pressure of 70 mT to 150 mT and at a plasma etch sputtering power of about 70 W to 300 w. The timings applied where argon/oxygen etching steps of 10 to 20 seconds, and argon soft sputtering steps of 10 to 20 seconds. The steps are repeated alternatingly. It was found that by applying a soft argon sputtering, the polysterene height remains unetched and the surface was smoother. Advantageously, a soft Ar sputtering can be achieved with at a plasma etch sputtering power of 70 W and a plasma etch gas pressure of about 70 mT. Compared with a continuous argon/oxygen etching, the polystyrene was only reduced with 4 nm, compared to 36 nm for the continuous argon/oxygen etching. FIG. 9 shows a scanning electron microscope image of the result of the etching process discussed above.

Further by way of example, embodiments of the present disclosure not being limited thereto, an example of results obtained using a sputter etching process as described above is shown. In the present example, first an Argon/Oxygen etching step is applied while thereafter an Argon sputtering step is applied. The results of the first etching step are shown on the left hand side of FIG. 10 in top view and cross-section, whereas the results after an additional second etching step are shown on the right hand side of FIG. 10 in top view and cross-section. The conditions used for the etching steps are, a 10 s etch in a mixture of Argon and oxygen 850 Ar/60 $O_2$ at 75 mT and 100 W for the first etching step and a 20 s sputtering at 70 mT and a power of 75 W in Argon for the second etching step. These steps (whereby the last step is a typical example of a soft Argon sputtering step) and the sequence thereof results in a good etching process, whereby no etching occurs in the polystyrene.

What is claimed is:

1. A method for block-copolymer lithography, the method comprising:
obtaining a self-organizing block-copolymer layer on a substrate, said self-organizing block-copolymer layer comprising at least two polymer components having mutually different etching resistances, said self-organizing block-copolymer layer furthermore comprising a copolymer pattern structure formed by micro-phase separation of said at least two polymer components,
applying at least once each
a first plasma etching of said self-organizing block-copolymer layer using plasma formed from a gas comprising an ashing gas, and
a second plasma etching of said self-organizing block-copolymer layer using a plasma formed from a substantially pure inert gas or mixture of inert gases in order to selectively remove a first polymer phase.

2. A method according to claim 1, wherein said applying second plasma etching is performed at a plasma etch sputtering power lower or equal to the plasma etch sputtering power of the first plasma etching and/or wherein said applying second plasma etching is performed at a plasma etch gas pressure lower or equal to the plasma etch gas pressure of the first plasma etching.

3. A method according to claim 1, wherein the ashing gas is oxygen.

4. The method according to claim 1, wherein the first plasma etching step is applied at least once before application of the second plasma etching step.

5. The method according to claim 1, wherein the second plasma etching step is applied at least once before application of the first plasma etching step.

6. The method according to claim 1, wherein performing said first plasma etching and said second plasma etching comprises repeating said first plasma etching and said second plasma etching at least once alternatingly.

7. The method according to claim 1, wherein said substantially pure inert gas is argon.

8. The method according to claim 1, wherein said performing a first plasma etching of said layer comprises using a plasma formed from an argon-oxygen gas mixture.

9. The method according to claim 1, furthermore comprising providing a pre-mask pattern on said substrate, said pre-mask pattern comprising a plurality of guides for aligning said copolymer pattern structure.

10. The method according to claim 1, in which said copolymer pattern structure is formed by annealing the block copolymer layer.

11. The method according to claim 1, wherein said block-copolymer comprises a di-block copolymer comprising two types of polymer chains covalently bonded to each other.

12. The method according to claim 11, wherein said di-block copolymer comprises polystyrene-polyisobutene, polystyrene-isoprene, polydimethylsiloxane-polyisobutene, polystyrene-polyethylene oxide, polystyrene-polypropylene oxide, polyethyleneoxide-poly(cyanobiphenyloxy)hexyl methacrylate, polystyrene-polymethyl methacrylate, polystyrene-polymethacrylic acid, polyethylene oxide-polyvinylpyridine, polystyrene-polyvinylpyridine, or polyisoprene-polyhydroxystyrene.

13. The method according to claim 1, wherein said block copolymer comprises a triblock copolymer in which two types of polymer chains A,B are bonded in an A-B-A form or in which three types of polymer chains A,B,C are bonded in an A-B-C form.

14. The method according to claim 1, furthermore comprising the step of etching the substrate using the remaining polymer component or components after etching away said first polymer component from the block copolymer layer as a resist mask.

15. The method according to claim 1, wherein
said applying second plasma etching is performed at a plasma etch sputtering power lower or equal to the plasma etch sputtering power of the first plasma etching and/or wherein said applying second plasma etching is performed at a plasma etch gas pressure lower or equal to the plasma etch gas pressure of the first plasma etching; and
the ashing gas is oxygen.

16. The method according to claim 1, wherein
said applying second plasma etching is performed at a plasma etch sputtering power lower or equal to the plasma etch sputtering power of the first plasma etching and/or wherein said applying second plasma etching is performed at a plasma etch gas pressure lower or equal to the plasma etch gas pressure of the first plasma etching; and performing said first plasma etching and said second plasma etching comprises repeating said first plasma etching and said second plasma etching at least once alternatingly.

17. The method according to claim 1,
wherein said applying second plasma etching is performed at a plasma etch sputtering power lower or equal to the plasma etch sputtering power of the first plasma etching and/or wherein said applying second plasma etching is performed at a plasma etch gas pressure lower or equal to the plasma etch gas pressure of the first plasma etching; and
further comprising providing a pre-mask pattern on said substrate, said pre-mask pattern comprising a plurality of guides for aligning said copolymer pattern structure.

18. The method according to claim 1, wherein
said applying second plasma etching is performed at a plasma etch sputtering power lower or equal to the plasma etch sputtering power of the first plasma etching and/or wherein said applying second plasma etching is performed at a plasma etch gas pressure lower or equal to the plasma etch gas pressure of the first plasma etching; and
said di-block copolymer comprises polystyrene-polyisobutene, polystyrene-isoprene, polydimethylsiloxane-polyisobutene, polystyrene-polyethylene oxide, polystyrene-polypropylene oxide, polyethyleneoxide-poly(cyanobiphenyloxy)hexyl methacrylate, polystyrene-polymethyl methacrylate, polystyrene-polymethacrylic acid, polyethylene oxide-polyvinylpyridine, polystyrene-polyvinylpyridine, or polyisoprene-polyhydroxystyrene.

19. The method according to claim 1,
wherein said applying second plasma etching is performed at a plasma etch sputtering power lower or equal to the plasma etch sputtering power of the first plasma etching and/or wherein said applying second plasma etching is performed at a plasma etch gas pressure lower or equal to the plasma etch gas pressure of the first plasma etching; and
further comprising the step of etching the substrate using the remaining polymer component or components after etching away said first polymer component from the block copolymer layer as a resist mask.

20. The method according to claim 1,
wherein said applying second plasma etching is performed at a plasma etch sputtering power lower or equal to the plasma etch sputtering power of the first plasma etching and/or wherein said applying second plasma etching is performed at a plasma etch gas pressure lower or equal to the plasma etch gas pressure of the first plasma etching;
wherein said first plasma etching and said second plasma etching comprises repeating said first plasma etching and said second plasma etching at least once alternatingly; and
further comprising the step of etching the substrate using the remaining polymer component or components after etching away said first polymer component from the block copolymer layer as a resist mask.

* * * * *